US006281113B1

(12) United States Patent
Maeda

(10) Patent No.: US 6,281,113 B1
(45) Date of Patent: Aug. 28, 2001

(54) METHOD FOR FORMING AN INTERPLAYER INSULATING FILM AND SEMICONDUCTOR DEVICE

(75) Inventor: Kazuo Maeda, Tokyo (JP)

(73) Assignees: Canon Sales Co., Inc.; Semiconductor Process Laboratory Co., Ltd., both of (JP)

(*) Notice: Subject to any disclaimer, the term of this patent is extended or adjusted under 35 U.S.C. 154(b) by 0 days.

(21) Appl. No.: 09/492,528

(22) Filed: Jan. 27, 2000

(30) Foreign Application Priority Data

Mar. 17, 1999 (JP) .................................. 11-072241
Jan. 18, 2000 (JP) .................................. 12-009418

(51) Int. Cl.⁷ .............................................. H01L 21/4763
(52) U.S. Cl. .......................................... 438/624; 438/622
(58) Field of Search .................... 438/622, 623, 438/624, 626, 743, 763, 770, 778, 618, 674, 675, 687, 692, 773

(56) References Cited

U.S. PATENT DOCUMENTS

| 4,634,496 | * | 1/1987 | Mase et al. ........................... 156/643 |
| 5,177,588 | | 1/1993 | Ii et al. ................................. 257/640 |
| 5,494,859 | | 2/1996 | Kapoor ................................. 437/235 |
| 5,989,998 | * | 11/1999 | Sugahara ............................. 438/523 |
| 6,016,000 | * | 1/2000 | Moslehi ............................... 257/522 |
| 6,066,573 | * | 5/2000 | Muroyama ........................... 438/778 |
| 6,083,835 | * | 7/2000 | Shue et al. ........................... 438/687 |

FOREIGN PATENT DOCUMENTS

| 0 881 678 A2 | 5/1998 | (EP) . |
| 2273605 | 11/1993 | (GB) . |
| 98/00862 | 6/1996 | (WO) . |
| 98/43286 | 3/1998 | (WO) . |

* cited by examiner

Primary Examiner—David Nelms
Assistant Examiner—David Nhu
(74) Attorney, Agent, or Firm—Lorusso & Loud

(57) ABSTRACT

A method for forming an interlayer insulating film is disclosed. This method includes the steps of: forming a first insulating film on a substrate, the film containing at least one of $H_2O$, C and a hydrocarbon; forming pores in the first insulating film by heat treatment of the first insulating film to discharge the $H_2O$, C or hydrocarbon therefrom; and forming a second insulating film on the porous first insulating film.

20 Claims, 14 Drawing Sheets

FIG. 1D Vacuum Annealing

FIG. 1E   H Plasma Treatment
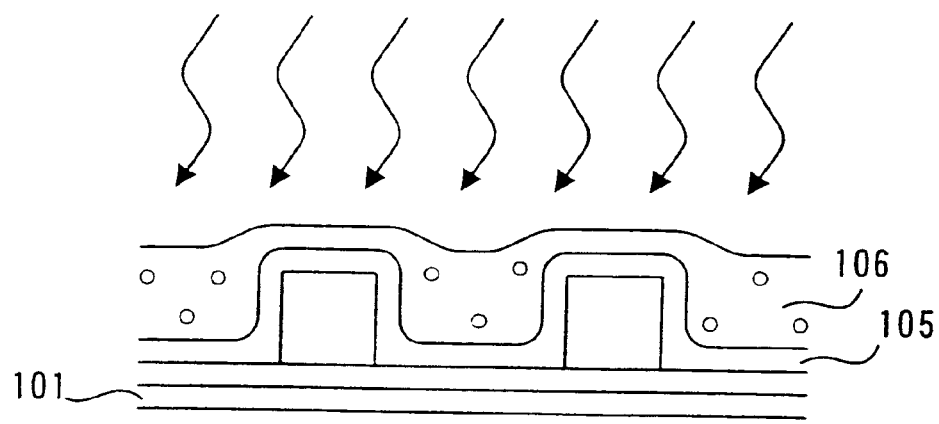
FIG. 1F
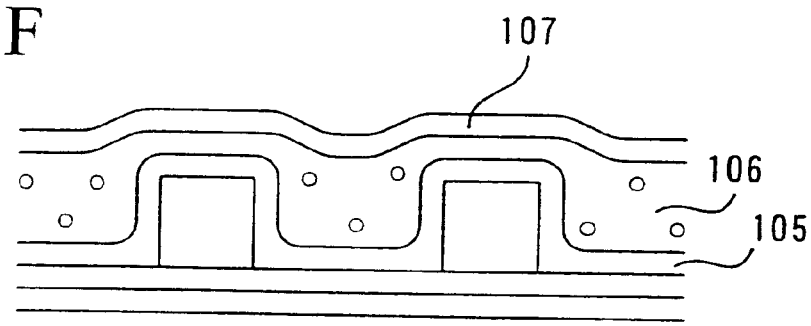

FIG. 6H  Polishing by CMP Method

METHOD FOR FORMING AN INTERLAYER INSULATING FILM AND SEMICONDUCTOR DEVICE

BACKGROUND OF THE INVENTION

1. Field of the Invention

The present invention relates to a method for forming an interlayer insulating film and, more particularly, to a method for forming an interlayer insulating film having a low dielectric constant, which is necessary for a highly-integrated semiconductor device.

2. Description of the Related Art

Progress in high integration of semiconductor devices in recent years has resulted in a narrower interval between wiring lines. As the narrowed interval between the wiring lines causes an increase in capacitance between the wiring lines, a need has been created for an interlayer insulating film which has a low dielectric constant.

More specifically, recent progress in high integration of an LSI device, has led to the wiring lines being micronized and multilayered which, in turn, has led to an increase in capacitance between the wiring lines. Such an increase in capacitance has caused a great reduction in operating speed. Thus, improvement in this regard has been strongly demanded. As one improvement measure, a method for reducing capacitance between the wiring lines has been studied. This method uses an interlayer insulating film which has a dielectric constant lower than that of $SiO_2$ currently used for an interlayer insulating film.

Typical interlayer insulating films of low dielectric constants currently under study are ① an SiOF film, and ② an organic insulating film of a low dielectric constant. Description will now be made of these films.

① SiOF Film

An SiOF film is formed by using source gas containing F and substituting Si—F bonds for a portion of the Si—O bonds in $SiO_2$. This SiOF film has a relative dielectric constant which is reduced as concentration of F in the film increases.

For forming such SiOF films, several methods have been reported (see p. 82 of monthly periodical "Semiconductor World", February issue of 1996). Most promising among these methods is one for forming an SiOF film by using $SiH_4$, $O_2$, Ar and $SiF_4$ as source gases in a high-density plasma enhanced CVD method (HDPCVD method). The relative dielectric constant of an SiOF film formed by this method is in a range of 3.1 to 4.0 (varies depending on F concentration in the film). This value is lower than the relative dielectric constant 4.0 of $SiO_2$, which has conventionally been used for the interlayer insulating film.

② Organic Insulating Film of Low Dielectric Constant

As an insulating film which has a lower dielectric constant (3.0 or lower) compared with the SiOF film, an organic insulating film of a low dielectric constant is now a focus of attention. Table 1 shows a few organic insulating films of low dielectric constants, which have been reported, and respective relative dielectric constants and thermal decomposition temperatures thereof.

TABLE 1

| Organic Insulating Film | Relative Dielectric Constant | Thermal Decomposition Temperature (° C.) | Note |
| --- | --- | --- | --- |
| Fluorine-containing resin | 2.4 | 420 | P. 82 of monthly periodical "Semiconductor World", February issue of 1997 |
| Cytop | 2.1 | 400 | P. 90 of monthly periodical "Semiconductor World", February issue of 1996 |
| Amorphous telon | 1.0 | 400 | P. 91 of monthly periodical "Semiconductor World", February issue of 1996 |

However, the SiOF film is disadvantageous in that an increase in concentration of F in the film leads to a reduction in moisture absorption resistance. The reduced moisture absorption resistance poses a serious problem, because a transistor characteristic and adhesion of a superimposed barrier metal layer are affected.

The organic insulating film of a low dielectric constant is easily peeled off, because of poor adhesion to a silicon wafer or the $SiO_2$ film. Furthermore, the organic insulating film is disadvantageous in that heat resistivity is low since its thermal decomposition temperature is around 400° C. The disadvantage of low heat resistivity poses a problem for annealing a wafer at a high temperature.

SUMMARY OF THE INVENTION

It is an object of the present invention to provide a method for forming an interlayer insulating film of a low dielectric constant, which has good moisture absorption resistance and heat resistivity. It is another object of the invention to provide a semiconductor device made by the above method.

According to the method of the present invention for forming an interlayer insulating film, first, an $SiO_2$ film containing $H_2O$, C or hydrocarbon is formed on a substrate. Then, this $SiO_2$ film is subjected to plasma or vacuum annealing. The vacuum annealing is performed by heating in a vacuum, i.e., at a pressure of 0.1 Torr or lower. If the pressure is 0.1 Torr or lower, a small quantity of $N_2$ or Ar may be contained in the atmosphere.

Then, by the annealing, gas contained in the $SiO_2$ film is discharged from the film, and the $SiO_2$ film becomes a porous $SiO_2$ film.

By experiment, the present inventor confirmed that the dielectric constant of the porous $SiO_2$ film lies in a range of 2.0 to 3.0. This value is smaller than the dielectric constant 4.0 of a conventional $SiO_2$ film having no porosity.

Since the porous $SiO_2$ film is formed by a conventional chemical vapor deposition method, better heat resistivity is provided.

After formation of the porous $SiO_2$ film, its surface can be made more stable by H (hydrogen) plasma treatment. In other words, by substituting Si—H bonds for dangling Si—O bonds in the surface, adsorption of water can be prevented.

Then, by forming a conventional $SiO_2$ film on the porous $SiO_2$ film, adsorption of water can be further prevented.

In a second embodiment of the method of the present invention for forming an interlayer insulating film, a first film is formed in concavities of a surface which has concavities and convexities. A first insulating film is then formed on the first film. The first insulating film has an etching rate lower than that of the first film. Then, holes are bored in the first insulating film, and selective etching of the first film is performed through the holes to eliminate corresponding areas of the first film. Then, a second insulating film is formed on the first insulating film to close the holes formed in the first insulating film.

Then, a cavity is formed within each concavity of the substrate and the first and second insulating films thereby become porous. Accordingly, an interlayer insulating film having cavities is formed on the substrate. The dielectric constant of this interlayer insulating film having cavities is apparently lower than that of a similar film without cavities. By experiment, the present inventor has confirmed that the dielectric constant of the interlayer insulating film having cavities was about 2.0. This value is lower than the dielectric constant 4.0 of a conventional $SiO_2$ film having no cavities. In addition, since the cavities are surrounded by the substrate and the conventional insulating film, no water adsorption occurs in the cavity. In other words, the above process results in formation, on the substrate, of an interlayer insulating film of a low dielectric constant, which has good moisture absorption resistance.

In a third embodiment of the method of the present invention for forming an interlayer insulating film, a first film is formed on a substrate. Then, a pattern is formed in the first film, i.e., a damascene trench which reaches the substrate. Then, a first insulating film is formed on the first film, on a side portion of the damascene trench and on a bottom portion of the same. Anisotropic etching is then performed for the first insulating film to eliminate the first insulating film formed on the bottom portion of the damascene trench while leaving the same formed on the side portion of the damascene trench. Subsequently, a Cu-plated film is buried in the damascene trench. In this case, by the first insulating film formed previously in the side portion of the damascene trench, a component in the first film can be prevented from dispersing into the Cu-plated film. Then, a barrier metal film is formed on the Cu-plated film. Due to this barrier metal film, components of a film formed on the Cu-plated film are prevented from dispersing into the Cu-plated film. Then, a second insulating film is formed on the first film and the barrier metal film, and holes are bored. Thereafter, selective etching of the first film is performed through the holes to eliminate corresponding areas of same. Accordingly, cavities are formed in the first film. Then, a second insulating film is formed on the first insulating film to close the holes. This process results in formation of an interlayer insulating film having cavities.

The dielectric constant of the interlayer insulating film having cavities formed in the above manner is apparently lower than that of an otherwise similar interlayer insulating film having no cavities. By experiment, the inventor confirmed that the dielectric constant of the interlayer insulating film having cavities was about 2.0. This value is lower than the dielectric constant 4.0 of a conventional $SiO_2$ film having no cavities. Moreover, since the cavities are surrounded by the conventional insulating film, no water adsorption occurs in the cavities. In other words, the process results in formation of an interlayer insulating film of a low dielectric constant, which has good moisture absorption resistance.

BRIEF DESCRIPTION OF THE DRAWINGS

FIGS. 1A to 1F are cross-sectional views showing a method for forming an interlayer insulating film according to a first embodiment of the present invention;

DESCRIPTION OF THE PREFERRED EMBODIMENTS (1) First Embodiment (FIGS. 1A to 1F)

Figure 1A:
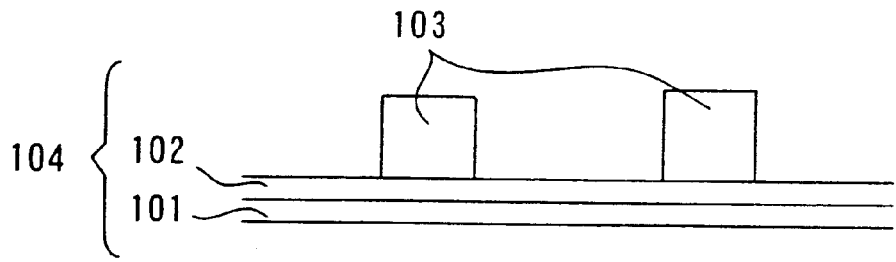

First, as shown in FIG. 1A, a BPSG (borophosphosilicate glass) film 102 is formed on a silicon substrate 101. Then, after an aluminum film is formed on the BPSG film 102, a pattern is formed in the aluminum to produce a wiring layer 103. The silicon substrate 101, the BPSG film 102 and the aluminum wiring layer 103 constitute a substrate 104 used in the method of the present invention.

Figure 1B:
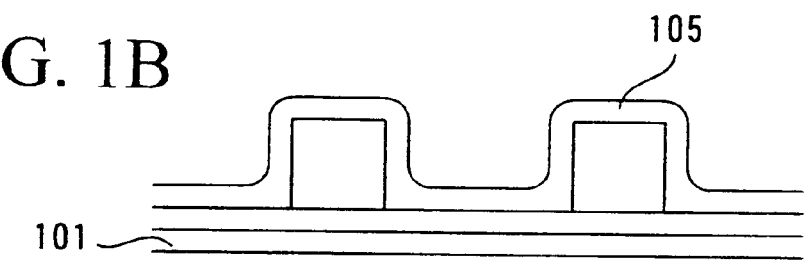

Then, as shown in FIG. 1B, a $SiO_2$ film 105 is formed on the substrate 104. This $SiO_2$ film 105 is formed by using $SiH_4$ and $N_2O$ as source gases, while keeping the silicon substrate 101 at 400° C., in a CVD method (chemical vapor deposition method). The $SiO_2$ film 105 can prevent $H_2O$ from being absorbed in the aluminum wiring layer 103.

Figure 1C:
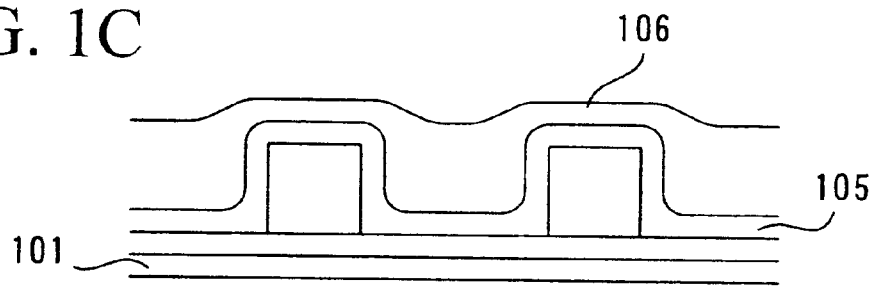
Figure 1C:
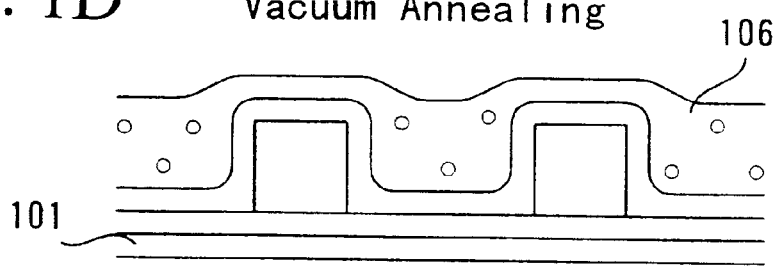

Subsequently, as shown in FIG. 1C, a $SiO_2$ film 106 is formed on the $SiO_2$ film 105. This $SiO_2$ film 106 is formed by using TEOS (tetraethoxysilane), $O_2$ and a small quantity of $H_2O$ as source gases, while keeping the silicon substrate 101 at 100° C., with application of RF power having a frequency of 13.56 MHz, and using a plasma enhanced CVD method at a pressure of 1 Torr. Flow rates of source gases at this time are 30~50 sccm, 100~600 sccm and 50~60 sccm, respectively, for TEOS, $O_2$ and $H_2O$. In this case, the use of the small quantity of $H_2O$ as a source gas results in inclusion of OH radicals and small quantity of $H_2O$ in the $SiO_2$ film 106. It should be noted that TMS (trimethylsilane) may also be used instead of the TEOS, at a flow rate of 30~50 sccm.

Then, as shown in FIG. 1D, vacuum annealing is performed for the $SiO_2$ film 106 at a pressure of 0.1 Torr while keeping the silicon substrate 101 at 400° C. The vacuum annealing is defined as an annealing that is performed in an atmosphere of reduced pressure. The annealing serves to discharge OH radicals and $H_2O$ from the $SiO_2$ film 106 to form a number of voids therein.

Instead of the aforementioned vacuum annealing, a plasma annealing may be performed for the $SiO_2$ film 106. The plasma annealing is defined an annealing that is performed in a plasmanized atmosphere. In the present embodiment, RF power is applied to the atmosphere via an upper electrode (not shown) and a lower electrode (not shown) so as to convert the atmosphere to a plasma. The process parameters of the plasma annealing are as follows: RF power having a frequency of 13.56 MHz and a power of 100 W is applied to the upper electrode, RF power having a frequency of 400 kHz and a power of 400 W is applied to the lower electrode, pressure is 0.2 Torr, temperature is 400°

C., time of annealing is 60~120 sec, and $O_2$ is introduced into the atmosphere at a flow rate of 600 sccm.

Then, as shown in FIG. 1E, a H hydrogen) plasma treatment is applied to the $SiO_2$ film 106. The H (hydrogen) plasma is generated by applying RF power to a H (hydrogen) containing atmosphere via the upper electrode (not shown) and the lower electrode (not shown). In the present embodiment the RF power applied to the upper electrode has a frequency of 13.56 MHz and a power of 50 W, and the RF power applied to the lower electrode has a frequency of 400 kHz and a power of 400 W. Further, the pressure of the H containing atmosphere is 0.1~0.2 Torr, the flow rate of H is 600 sccm, and the time of the H plasma treatment is 60 sec. During the H plasma treatment the temperature of the silicon substrate 101 is maintained at 400° C.

At this time, plasma H atoms enter the voids formed in the $SiO_2$ film 106, and SiH bonds are formed on the surface of the voids by the H atoms and Si atoms at the surface. Accordingly, the surfaces of the voids become stable, and absorption of water into the $SiO_2$ film 106 can be slowed pending further processing. Also, since the interiors of the voids are filled with $H_2$ molecules, which have no dipole moment, the dielectric constant of the $SiO_2$ film 106 is 3.0 or lower. This value is smaller than the dielectric constant 4.0 of a conventional $SiO_2$ film.

In the H (hydrogen) plasma treatment, the plasma H atoms do not enter the $SiO_2$ film 105, formed below the $SiO_2$ film 106, very deeply. Accordingly, the H atoms can be prevented from affecting the substrate 104 formed below the $SiO_2$ film 105.

Then, as shown in FIG. 1F, a $SiO_2$ film 107 is formed on the $SiO_2$ film 106. This $SiO_2$ film 107 is formed by a CVD method, using $SiH_4$ and $N_2O$ as source gases, while keeping the silicon substrate 101 at 400° C. The $SiO_2$ film 107 serves to prevent incursion of water into the previously formed porous $SiO_2$ film 106, and the $H_2$ atoms filling the interiors of the voids of the $SiO_2$ film 106 can be prevented from being discharged from the film.

The foregoing process of forming the $SiO_2$ films 105, 106 and 107 results in formation of an interlayer insulating film of a low dielectric constant on the substrate 104. In other words, since the $SiO_2$ film 106 has porosity and the insides of the voids are filled with $H_2$ molecules having no dipole moment, the dielectric constant thereof is smaller than that of a conventional $SiO_2$ film. Also, the $SiO_2$ films 107 and 105 are formed on and below $SiO_2$ film 106, respectively. These films can prevent incursion of water into the porous $SiO_2$ film 106, and the $H_2$ molecules inside the voids from being discharged from the film.

(2) Second Embodiment (FIGS. 2A to 2F)

The second embodiment is different from the first embodiment in that $SiH_4$ is used as source gas instead of TEOS for forming a porous $SiO_2$ film.

Figure 2A:
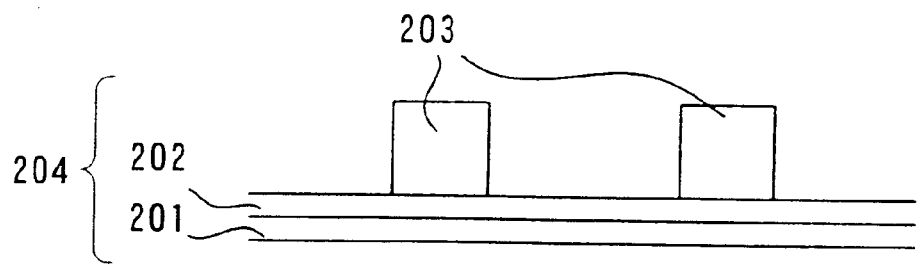
FIGS. 2A to 2F are cross-sectional views showing a method for forming an interlayer insulating film according to a second embodiment of the invention.

First, as shown in FIG. 2A, a BPSG (borophosphosilicate glass) film 202 is formed on a silicon substrate 201. After an aluminum layer is formed on the BPSG film 202, a pattern is formed in the aluminum to form an aluminum wiring layer 203. Then, the silicon substrate 201, the BPSG film 202 and the aluminum wiring layer 203 constitute the substrate 204 used in the method of the present invention.

Figure 2B:
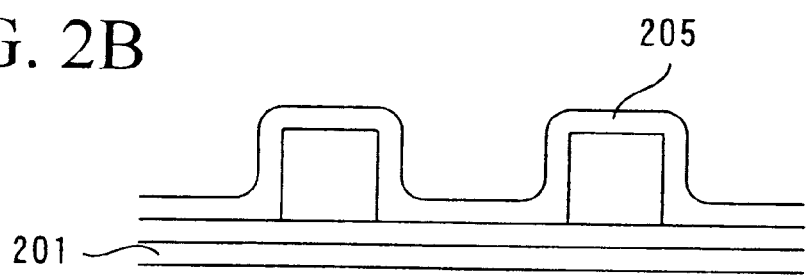

Then, as shown in FIG. 2B, an $SiO_2$ film 205 is formed on the substrate 204. This $SiO_2$ film 205 is formed by a CVD method (chemical vapor deposition method), which employs $SiH_4$ and $N_2O$ as source gases, while keeping the silicon substrate 201 at 400° C. The $SiO_2$ film 205 can prevent $H_2O$ from dispersing into the aluminum wiring layer 203.

Figure 2C:
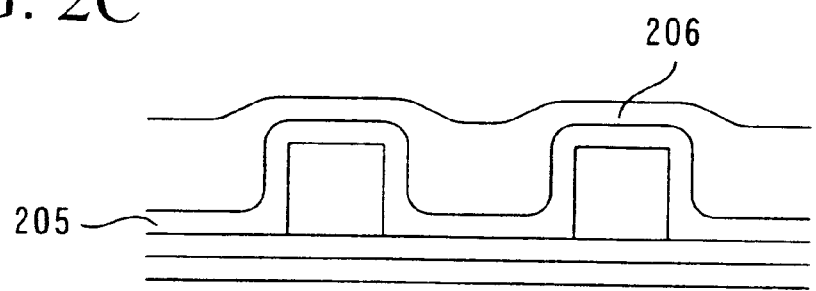

Subsequently, as shown in FIG. 2C, a $SiO_2$ film 206 is formed on the $SiO_2$ film 205. This $SiO_2$ film 206 is formed by a CVD method, which employs $SiH_4$, $O_2$ and a small quantity of $H_2O$ as source gases, while keeping the silicon substrate 201 at 100° C., and at a pressure of 3 Torr. Flow rates of source gases are 30~50 sccm. 90~100 sccm, 30~50 sccm and 200~600 sccm respectively for $SiH_4$, $O_2$, $H_2O$ and Ar. In this case, the use of the small quantity of $H_2O$ as a source gas results in inclusion of small quantity of $H_2O$ in the $SiO_2$ film 206.

Figure 2D:
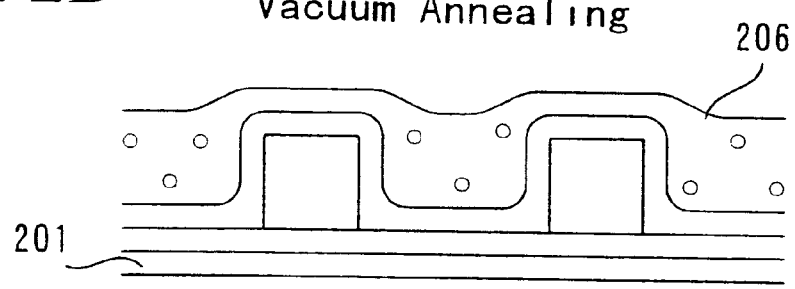

Then, as shown in FIG. 2D, vacuum annealing is performed for $SiO_2$ film 206 by keeping the silicon substrate 201 at 400° C. Ad at a pressure of 0.1 Torr. Accordingly, $H_2O$ contained in the $SiO_2$ film 206 is discharged therefrom, and a number of voids are formed therein.

Instead of performing the vacuum annealing, a plasma annealing may be performed for the $SiO_2$ film 206. In the present embodiment, RF power is applied to the atmosphere via an upper electrode (not shown) and a lower electrode (not shown) so as to convert the atmosphere to a plasma. And the process conditions of the plasma annealing are as follows: RF power having a frequency of 13.56 MHz and a power of 100 W is applied to the upper electrode, RF power having a frequency of 400 kHz and a power of 400 W is applied to the lower electrode, pressure is 0.2 Torr, temperature is 400° C., time of annealing is 60~120 sec, and $O_2$ is introduced into the atmosphere at a flow rate of 600 sccm.

Figure 2E:
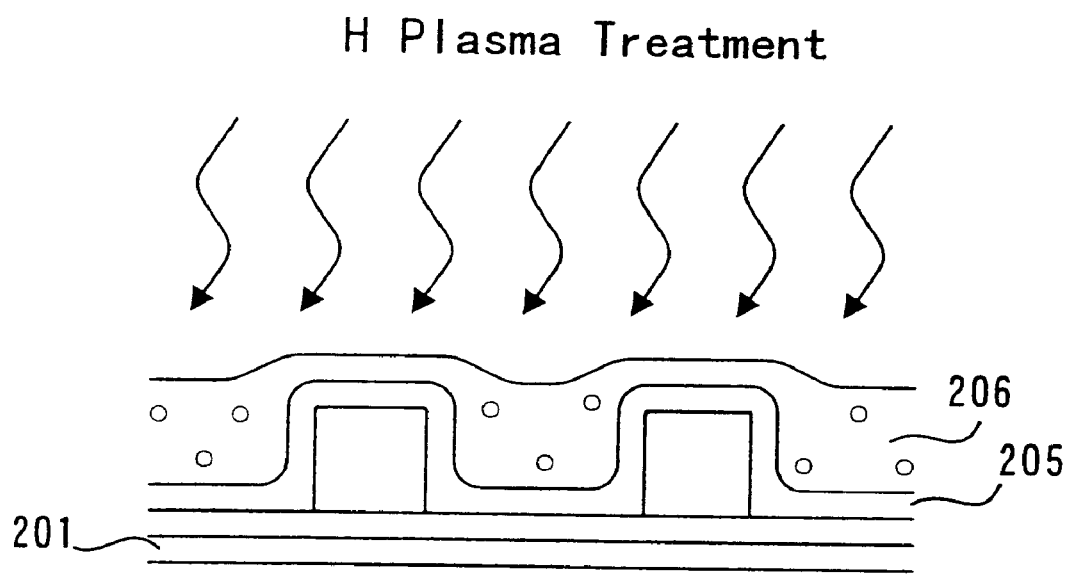

Then, as shown in FIG. 2E, H (hydrogen) plasma treatment is performed for the $SiO_2$ film 206 in the same way as in the first embodiment. That is, the H (hydrogen) plasma is generated by applying RF power to a H (hydrogen) containing atmosphere via the upper electrode (not shown) and the lower electrode (not shown). The RF power applied to the upper electrode has a frequency of 13.56 MHz and a power of 50 W, and the RF power applied to the lower electrode has a frequency of 400 kHz and a power of 400 W. Further, the pressure of the H containing atmosphere is 0.1~0.2 Torr, the flow rate of H is 600 sccm, and the time of the H plasma treatment is 60 sec. During the H plasma treatment the temperature of the silicon substrate 201 is maintained at 400° C.

At this time, plasma H atoms enter the voids formed in the $SiO_2$ film 206. By reaction of the H atoms with the Si atoms on the surfaces of the voids, Si—H bonds are formed on the surfaces of the same. Accordingly, the surfaces of the voids are stabilized, and incursion of water into the $SiO_2$ film 206 can be slowed down pending further processing. Also, since the insides of the voids are filled with $H_2$ molecules having no dipole moment, the dielectric constant of the $SiO_2$ film 206 lies in a range of 2.0 to 3.0, which is smaller than the dielectric constant 4.0 of a conventional $SiO_2$ film.

In the H (hydrogen) plasma treatment, the plasma H atoms do not enter the $SiO_2$ film 205 formed below the $SiO_2$ film 206 very deeply. Accordingly, the H atoms can be prevented from affecting the substrate 204 formed below the $SiO_2$ film 205.

Figure 2F:
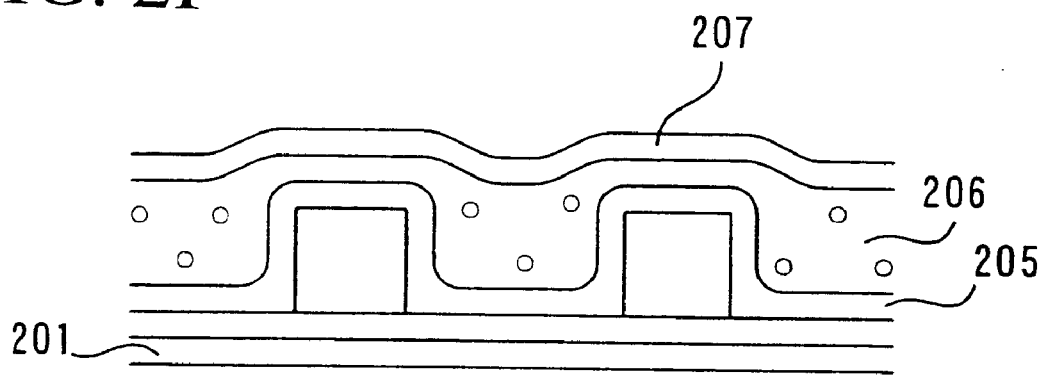

Then, as shown in FIG. 2F, a $SiO_2$ film 207 is formed on the $SiO_2$ film 206. This $SiO_2$ film 207 is formed by a CVD method, using $SiH_4$ and $N_2O$ as source gases, while keeping the silicon substrate 201 at 400° C. The $SiO_2$ film 207 prevents incursion of water into the previously formed porous $SiO_2$ film 206 and $H_2O$ molecules filling the inside of the voids of the $SiO_2$ film 206 can be prevented from being discharged from the film.

As in the case of the first embodiment, the foregoing process of forming the $SiO_2$ films 205, 206 and 207 results in formation of an interlayer insulating film of a low dielectric constant on the substrate 204. In other words, since the $SiO_2$ film 206 has porosity and the insides of the voids are filled with $H_2$ molecules having no dipole moment, the dielectric constant of the $SiO_2$ flim 206 is smaller than that of a conventional $SiO_2$ film. Also, the conventional $SiO_2$ films 205 and 207 are formed below and on the $SiO_2$ film 206. Accordingly, incursion of water into the porous $SiO_2$ film 206 can be prevented, and $H_2$ molecules inside the voids can be prevented from being discharged from the film.

(3) Third Embodiment (FIGS. 3A to 3F)

The third embodiment is different from the first and second embodiments in that the porous insulating film is formed using $B_2H_6$ is used as the source gas.

Figure 3A:
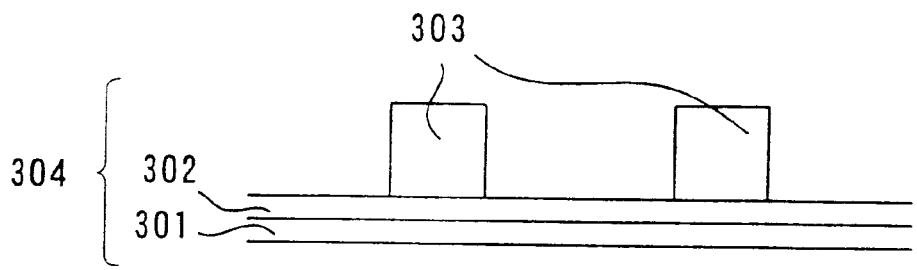
FIGS. 3A to 3F are cross-sectional views showing a method for forming an interlayer insulating film according to a third embodiment of the invention.

First, as shown in FIG. 3A, a BPSG (borophosphosilicate glass) film 302 is formed on a silicon substrate 301. Then, after an aluminum film is formed thereon, a pattern is formed in the aluminum film to produce an aluminum wiring layer 303. The silicon substrate 301, the BPSG film 302 and the aluminwn wiring layer 303 constitute the substrate 304 used in the method of the present invention.

Figure 3B:
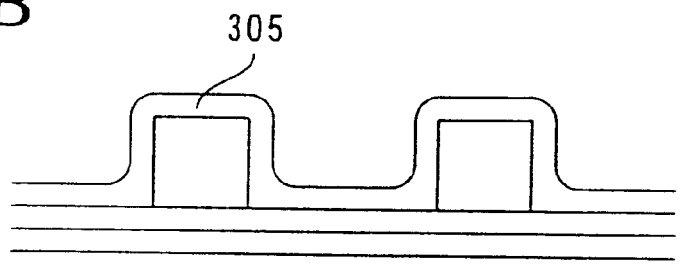

Then, as shown in FIG. 3B, a $SiO_2$ film 305 is formed on the substrate 304. This $SiO_2$ film 305 is formed by a CVD method (chemical vapor deposition method), using $SiH_4$ and $N_2O$ as source gases, while keeping the silicon substrate 301 at 400° C. The $SiO_2$ film 305 can prevent $H_2O$ from dispersing into the aluminum wiring layer 203.

Figure 3C:
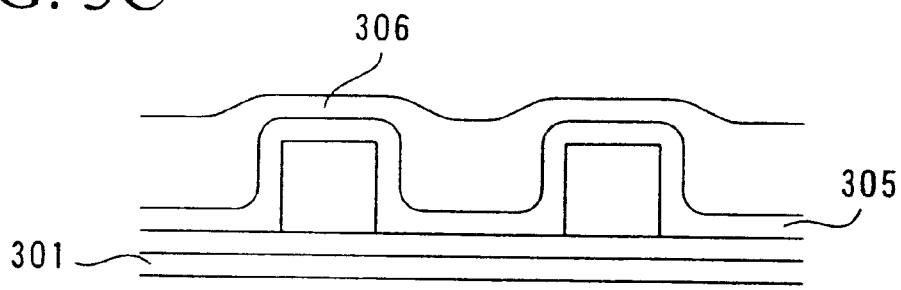

Then, as shown in FIG. 3C, a B (boron)-containing $SiO_2$ film 306 is formed on the $SiO_2$ film 305. This $SiO_2$ film 306 is formed by using $SiH_4$, $O_2$ and $B_2H_6$ as source gases while keeping the silicon substrate 301 at 100° C., applying an RF power having a frequency of 13.56 MHz, using a plasma enhanced CVD method at a source gas pressure of 1 Torr. Flow rates of source gases are 30~50 sccm, 120 sccm and 24~30 sccm respectively for $SiH_4$, $O_2$ and $B_2H_6$. $N_2O$ at a flow rate of 1000 sccm can also be contained in the source gases. During the formation of the film 305, $O_2$ of the source gas and H contained in $SiH_4$ or $B_2H_6$ generate $H_2O$. Accordingly, the B (boron)-containing $SiO_2$ film 306 contains a small quantity of $H_2O$.

Figure 3D:
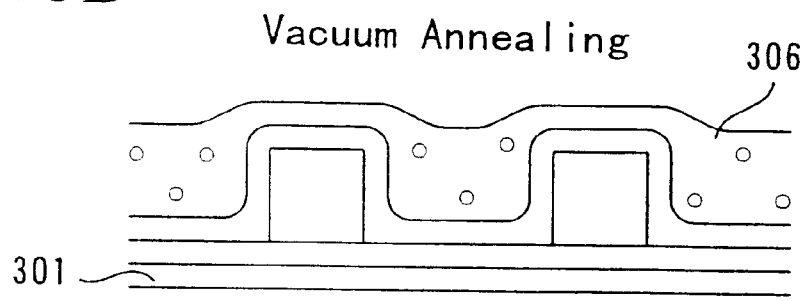

Then, as shown in FIG. 3D, vacuum annealing may also be performed for the $SiO_2$ film 306 by keeping the silicon substrate 301 at 400° C. Ad at a pressure of 0.1 Torr. Accordingly, $H_2O$ and B (boron) contained in the $SiO_2$ film 306 are discharged from the film, and a number of voids are formed therein.

Instead of performing the vacuum annealing, a plasma annealing may be performed for the $SiO_2$ film 306. In the present embodiment, RF power is applied to the atmosphere via an upper electrode (not shown) and a lower electrode (not shown) so as to convert the atmosphere into a plasma And the process parameters of the plasma annealing are as follows: RF power having a frequency of 13.56 MHz and a power of 100 W is applied to the upper electrode, RF power having a frequency of 400 kHz and a power of 400 W is applied to the lower electrode, pressure is 0.2 Torr, temperature is 400° C., time of annealing is 60~120 sec, and $O_2$ is contained in the atmosphere with a flow rate of 600 sccm.

Figure 3E:
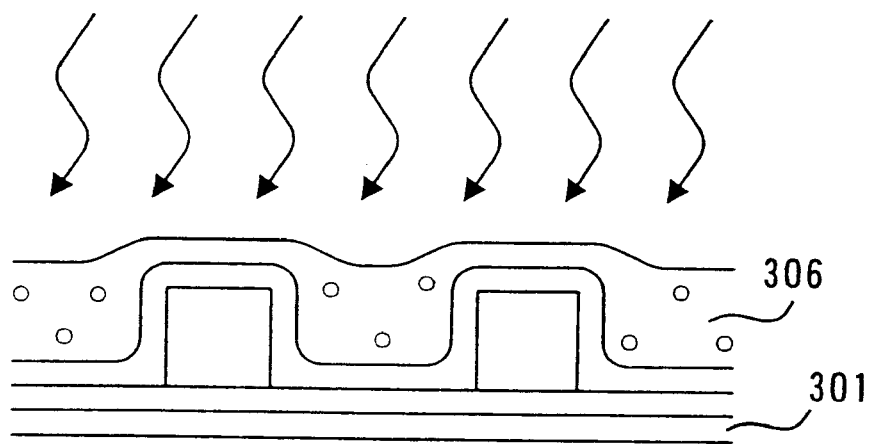

Then, as shown in FIG. 3E, a H (hydrogen) plasma treatment is performed for the $SiO_2$ film 306 in the same way as in the first and second embodiments. That is, the H (hydrogen) plasma is generated by applying RF power to a H (hydrogen) containing atmosphere via the upper electrode (not shown) and the lower electrode (not shown). The RF power applied to the upper electrode has a frequency of 13.56 MHz and a power of 50 W, and the RF power applied to the lower electrode has a frequency of 400 kHz and a power of 400 W. Further, the pressure of the H containing atmosphere is 0.1 0.2 Torr, the flow rate of H is 600 sccm, and the time of the H plasma treatment is 60 sec. During the H plasma treatment the temperature of the silicon substrate 301 is maintained at 400° C.

At this time, plasma H atoms enter a large number of voids formed in the $SiO_2$ film 306. By reaction of the H atoms with the Si atoms on the surfaces of the voids, Si—H bonds are formed on the surfaces of the voids. Accordingly, the surfaces of the voids are stabilized, and incursion of water into the $SiO_2$ film 306 can be slowed down pending further processing. Also, since the inside of the voids are filled with $H_2$ molecules having no dipole moment, the dielectric constant of the $SiO_2$ film 306 is in a range of 2.0 to 3.0, which is smaller than the dielectric constant 4.0 of a conventional $SiO_2$ film.

Figure 3F:
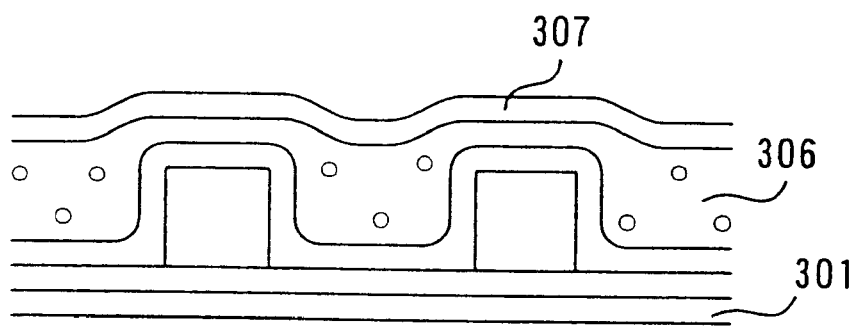

Then, as shown in FIG. 3F, a $SiO_2$ film 307 is formed on the $SiO_2$ film 306. This $SiO_2$ film 307 is formed by a CVD method, which uses $SiH_4$ and $N_2O$ as source gases, while keeping the silicon substrate 301 at 400° C. The $SiO_2$ film 307 prevents incursion of water into the previously formed $SiO_2$ film 306 and $H_2$ filling the inside of the voids of the $SiO_2$ film 305 can be prevented from being discharged from the film.

The foregoing process of forming the $SiO_2$ film 305, 306 and 307 results in formation of an interlayer insulating film of a low dielectric constant on the substrate 304. In other words, since the $SiO_2$ film 306 has porosity and the interior of the voids are filled with $H_2$ molecules having no dipole moment, the dielectric constant of the $SiO_2$ film 306 is smaller than that of a conventional $SiO_2$ film. Also, the $SiO_2$ film 307 is formed on the $SiO_2$ film 306. Since this film 307 is a conventional $SiO_2$ film, incursion of water into the porous $SiO_2$ film 306 can be prevented, and $H_2$ molecules in the voids can be prevented from being discharged from the film.

(4) Fourth Embodiment (FIGS. 4A to 4F)

The fourth embodiment is different from the first to third embodiments in that $C_2F_6$ is used as a source gas for forming a porous $SiO_2$ film.

Figure 4A:
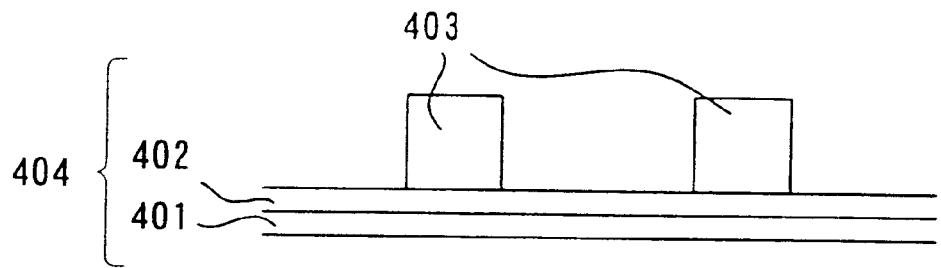
FIGS. 4A to 4F are cross-sectional views showing a method for forming an interlayer insulating film according to a fourth embodiment of the invention.

First, as shown in FIG. 4A, a BPSG (borophosphosilicate glass) film 402 is formed on a silicon substrate 401. Then, after an aluminum film is formed thereon, a pattern is formed in the aluminum film to produce an aluminum wiring layer 403. The silicon substrate 401, the BPSG film 402 and the aluminum wiring layer 403 constitute a substrate 404 for use in the method of the present invention.

Figure 4B:
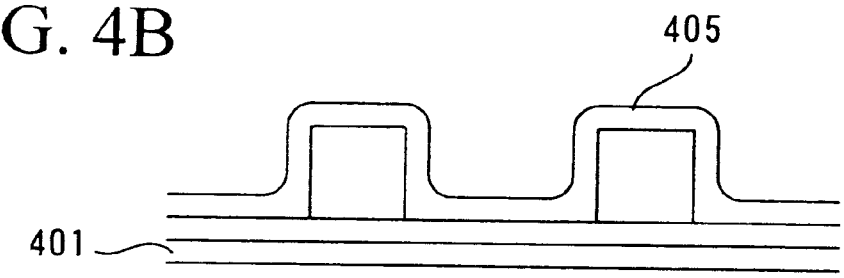

Then, as shown in FIG. 4B, a $SiO_2$ film 405 is formed on the substrate 404. This $SiO_2$ film 405 is formed by a CVD method (chemical vapor deposition method), using $SiH_4$ and $N_2O$ as source gases, while keeping the silicon substrate 401 at 400° C. The $SiO_2$ film 405 prevents $H_2O$ from dispersing into the aluminum wiring layer 403.

Figure 4C:
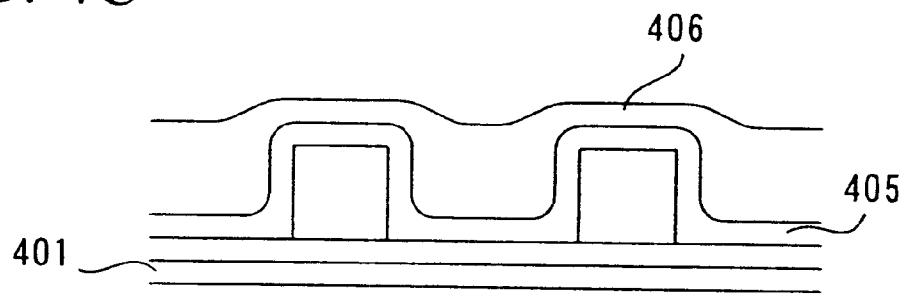

Subsequently, as shown in FIG. 4C, a F (fluorine)-containing $SiO_2$ film 406, which will later be converted to a porous insulating film, is formed on the $SiO_2$ film 405. This $SiO_2$ film 406 is formed by using TEOS (tetraethoxysilane), $O_2$ and $C_2F_6$ as source gases while keeping the silicon substrate 401 at 100° C., applying RF power having a frequency of 13.56 MHz, and by a plasma enhanced CVD method at a source gas pressure of 1 Torr. Flow rates of source gases at this time are 30~50 sccm, 600 sccm and 40~60 sccm respectively for TEOS, $O_2$ and $C_2F_6$. $N_2O$ with a flow rate of 1000 sccm can also be contained in the source gases. During the formation of the film 406, $O_2$ of the source gas and C contained in TEOS or $C_2F_6$ generate hydrocarbon, and $O_2$ of the source gas and H contained in TEOS generate $H_2O$. Accordingly, the $SiO_2$ film 406 contains hydrocarbon and $H_2O$. It should be noted that TMS (trimethylsilane) may be used instead of the TEOS. The flow rate of the TMS is 30~50 sccm.

Figure 4D:
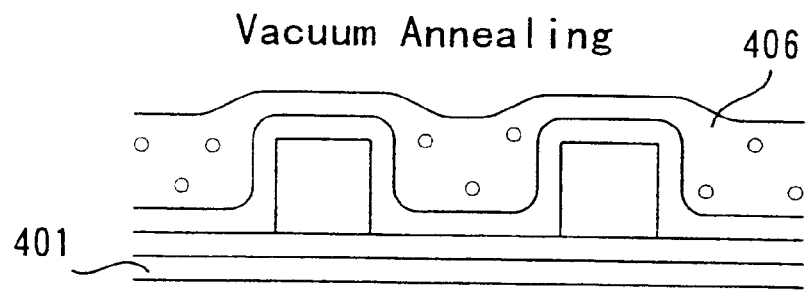

Then, as shown in FIG. 4D, vacuum annealing is performed for the $SiO_2$ film 406 by heating the silicon substrate 401 at 400° C. Ad at pressure of 0.1 Torr. Accordingly, hydrocarbon, $H_2O$ and F (fluorine) contained in the $SiO_2$ film 406 are discharged from the film, and a number of voids are formed therein.

Instead of performing the vacuum annealing, a plasma annealing may be applied to the $SiO_2$ film 406. In the present embodiment, RF power is applied to the atmosphere via an upper electrode (not shown) and a lower electrode (not shown) so as to convert the atmosphere to a plasma. And the process conditions of the plasma annealing are as follows: RF power having a frequency of 13.56 MHz and a power of 100 W is applied to the upper electrode, RF power having a frequency of 400 kHz and a power of 400 W is applied to the lower electrode, pressure is 0.2 Torr, temperature is 400° C., time of annealing is 60~120 sec, and $O_2$ is introduced into the atmosphere at a flow rate of 600 sccm.

Figure 4E:
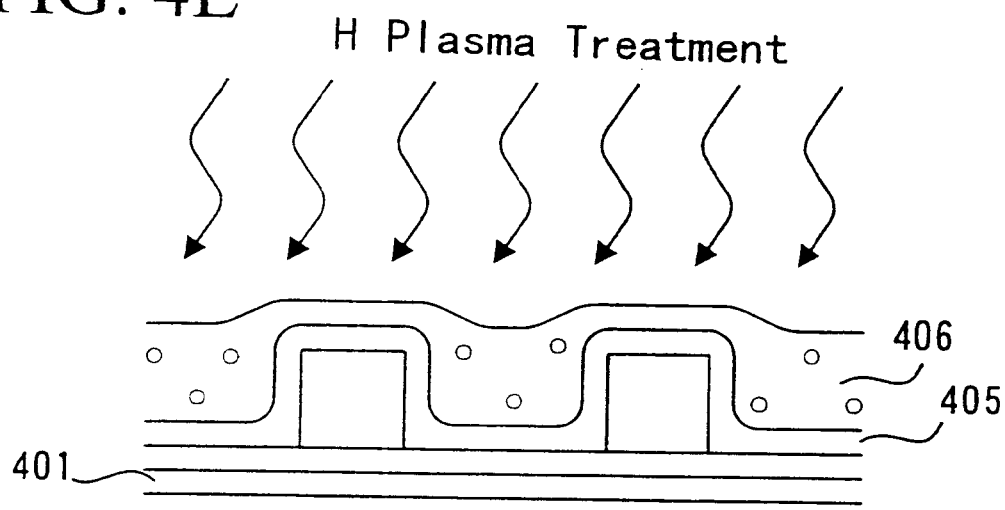

Then, as shown in FIG. 4E, H (hydrogen) plasma treatment is performed for the $SiO_2$ film 406 in the same way as in the first to third embodiments. That is, a H (hydrogen) plasma is generated by applying RF power to a H (hydrogen) containing atmosphere via the upper electrode (not shown) and the lower electrode (not shown). The RF power applied to the upper electrode has a frequency of 13.56 MHz and a power of 50 W, and the RF power applied to the lower electrode has a frequency of 400 kHz and a power of 400 W. Further, the pressure of the H containing atmosphere is 0.1~0.2 Torr, the flow rate of H is 600 sccm, and the time for the H plasma treatment is 60 sec. During the H plasma treatment the temperature of the silicon substrate 301 is maintained at 400° C.

At this time, plasma H atoms enter a large number of voids formed in the $SiO_2$ film 406. By reaction of the H atoms with the Si atoms on the surface of the voids, Si—H bonds are formed on the surfaces of the voids. Accordingly, the surfaces of the voids are stabilized, and incursion of water into the $SiO_2$ film 406 can be slowed down pending further processing. Also, since the interiors of the voids are filled with $H_2$ molecules having no dipole moment, the dielectric constant of the $SiO_2$ film 406 lies in a range of 2.0 to 3.0, which is smaller than the dielectric constant 4.0 of a conventional $SiO_2$ film.

In the H (hydrogen) plasma treatment, the plasma H atoms do not enter the $SiO_2$ film 405 formed below the $SiO_2$ film 406 very deeply. Thus, the H atoms can be prevented from affecting the substrate 404 below the $SiO_2$ film 405.

Figure 4F:
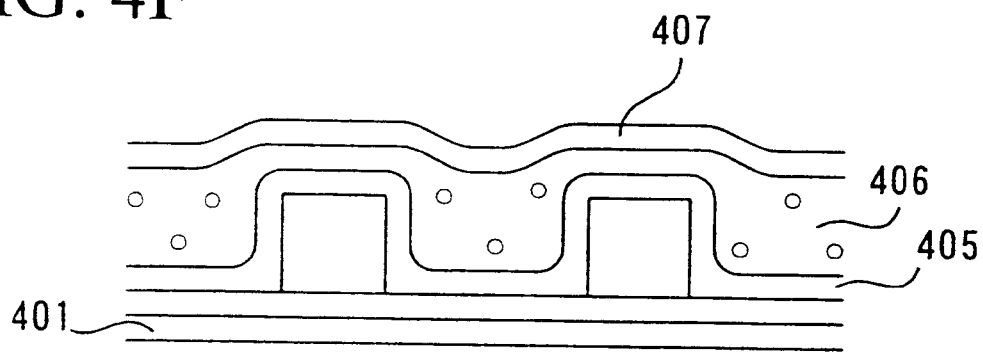

Then, as shown in FIG. 4F, a $SiO_2$ film 407 is formed on the $SiO_2$ film 406. This $SiO_2$ film 407 is formed by a CVD method, using $SiH_4$ and $N_2O$ as source gases, while keeping the silicon substrate 401 at 400° C. The $SiO_2$ film 407 prevents incursion of water into the previously formed porous $SiO_2$ film 406 and $H_2$ molecules filling the interiors of the voids of the $SiO_2$ film 406 can be prevented from being discharged from the film.

The foregoing process of forming the $SiO_2$ films 405, 406 and 407 results in formation of an interlayer insulating film of a low dielectric constant on the substrate 404. In other words, since the $SiO_2$ film 406 has porosity and the interiors of the voids are filled with $H_2$ molecules having no dipole moment, the dielectric constant of the $SiO_2$ film 406 is smaller than that of a conventional $SiO_2$ film. Also, because the conventional $SiO_2$ films 405 and 407 are formed below and on the porous $SiO_2$ film 406, incursion of water into the porous $SiO_2$ film 406 can be prevented, and $H_2$ molecules inside the voids can be prevented from being discharged from the film.

(5) Fifth Embodiment (FIGS. 5A to 5M)

According to the fifth embodiment, a photoresist is buried in a substrate and, by etching, cavities are formed in an interlayer insulating film, as described below.

Figure 5A:
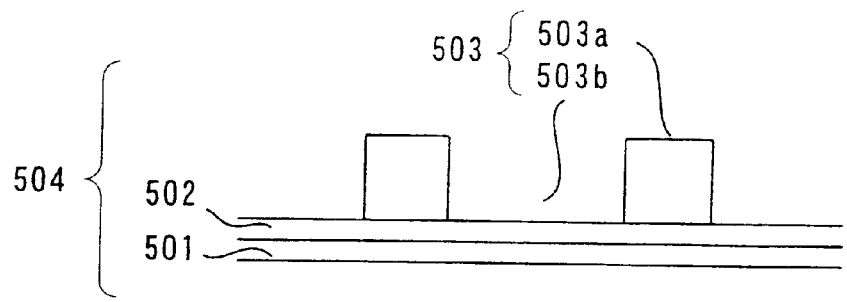
FIGS. 5A to 5H are cross-sectional views showing a method for forming an interlayer insulating film according to a fourth embodiment of the invention.

First, as shown in FIG. 5A, a BPSG (borophosilicate glass) film 502 is formed on a silicon substrate 501. Then, after an aluminum film is formed thereon, a pattern is formed in the aluminum film to produce an aluminum wiring layer 503. The silicon substrate 501, the BPSG film 502 and the aluminum wiring layer 503 constitute substrate 504 to be used in the method of the present invention.

Figure 5B:
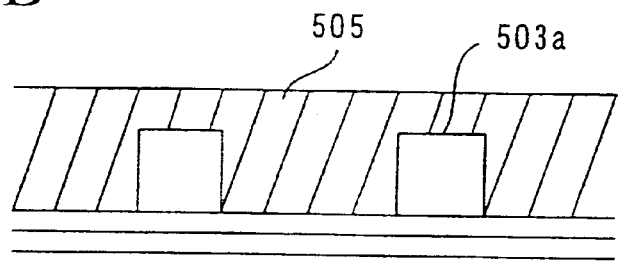

Then, as shown in FIG. 5B, a photoresist 505 is coated on the substrate 504 so as to cover the convexities 503a of the wiring layer. The photoresist covering the convexities 503a of the wiring layer will be eliminated later. Thus, the photoresist 505 should have a thickness which facilitates the elimination.

Figure 5C:
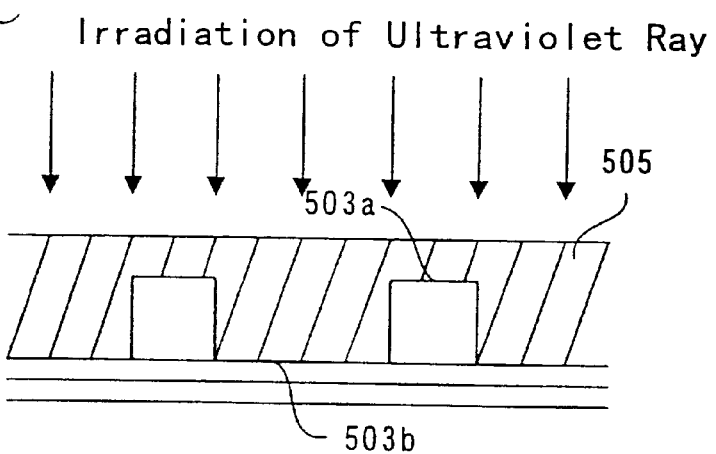

Then, as shown in FIG. 5C, the photoresist 505 is irradiated uniformly with ultraviolet radiation. Ultraviolet radiation of low intensity should be used, which eliminates only the photoresist covering the convexities 503a of the wiring layer, but not the photoresist in concavities 503b of the wiring layer in the following step.

Figure 5D:
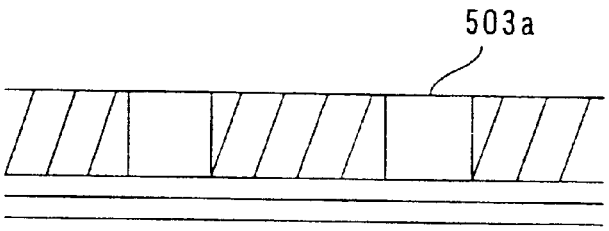

Subsequently, as shown in FIG. 5D. the photoresist covering the convexities 503a of the wiring layer is developed and eliminated.

Figure 5E:
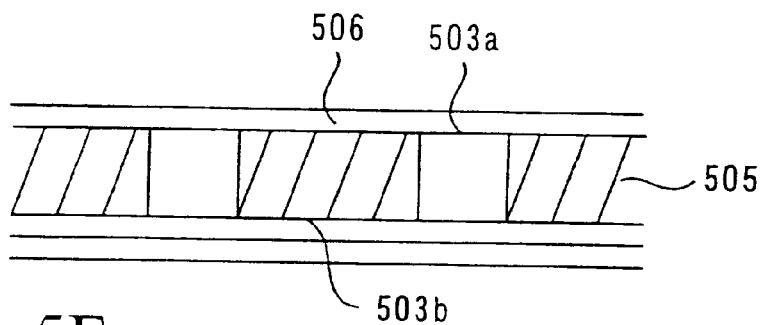

Then, as shown in FIG. 5E, a $SiO_2$ film 506 is formed on the convexities 503a of the wiring layer and the remaining photoresist 505 by a plasma enhanced CVD method (chemical vapor deposition method). Accordingly, the remaining photoresist 505 is confined between the concavities 503b of the wiring layer and the $SiO_2$ film 506.

Figure 5F:
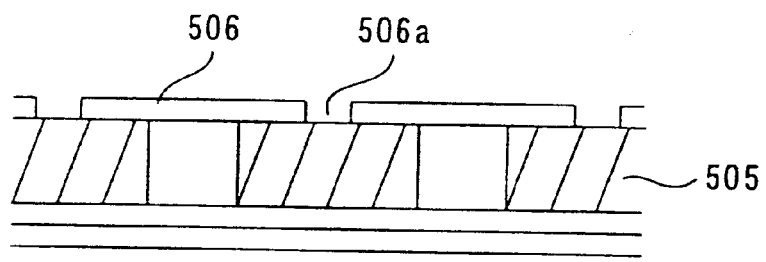

Then, as shown in FIG. 5F. a hole 506a is formed in the $SiO_2$ film 506 formed on the remaining photoresist 505. This hole 506a will be used later for etching the confined photoresist 505. After etching, the hole will be closed by another $SiO_2$ film. Thus, the diameter of the hole should be set small enough for closing later.

Figure 5G:
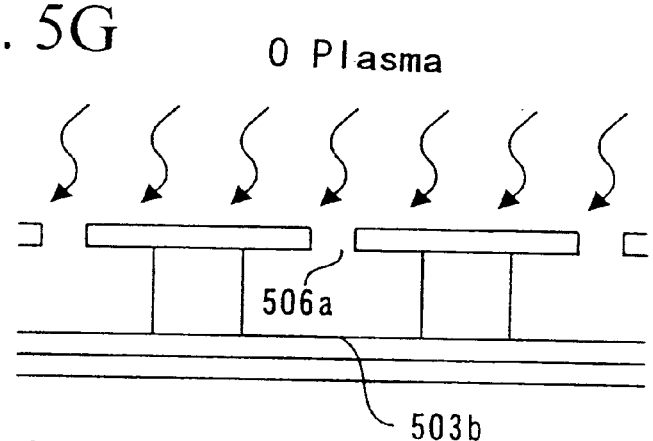

Subsequently, as shown in FIG. 5G, the photoresist 505 confined between the concavity 503b of the wiring layer and the $SiO_2$ film 506 is etched by O plasma through the hole 506a.

Figure 5H:
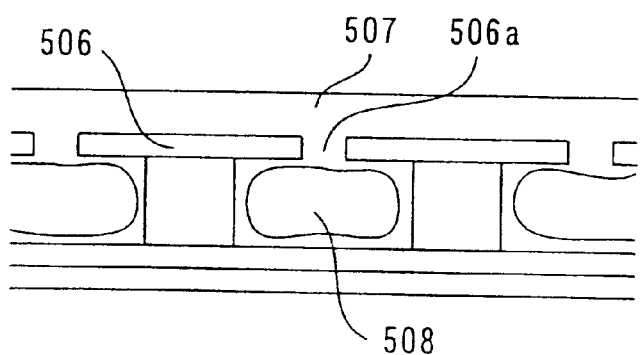

Then, as shown in FIG. 5H, an $SiO_2$ film 507 having a film thickness of 300 nm is formed on the $SiO_2$ film 506 by a plasma enhanced CVD method. Accordingly, the hole 506a is closed, and a cavity 508 is formed in an area surrounded by the concavity 503b of the wiring layer and the $SiO_2$ films 506 and 507.

The foregoing process results in formation of an interlayer insulating film of $SiO_2$ having cavities on the substrate 504. This interlayer insulating film has a dielectric constant smaller than that of a conventional $SiO_2$ interlayer insulating film. In other words, since the dielectric constant of the cavity portion is smaller than that of $SiO_2$, the overall dielectric constant of the entire film is about 2.0, which is smaller than the dielectric constant 4.0 of a similar film without cavities.

Figure 6A:
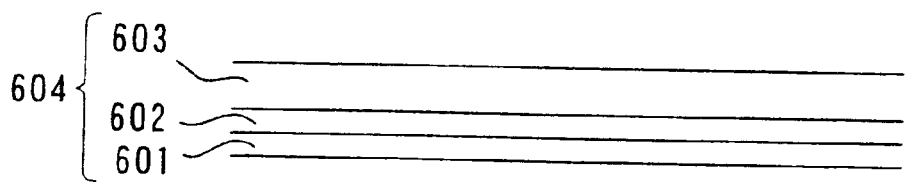
FIGS. 6A to 6N are cross-sectional views showing a method for forming an interlayer insulating film according to a sixth embodiment of the invention.
Figure 6B:
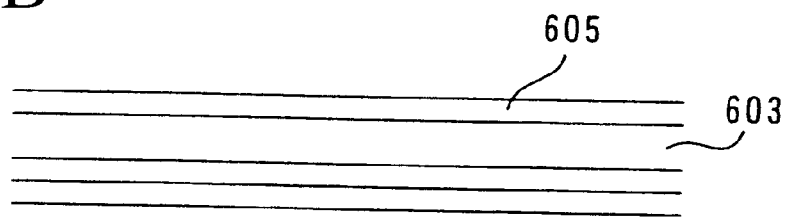
Figure 6C:
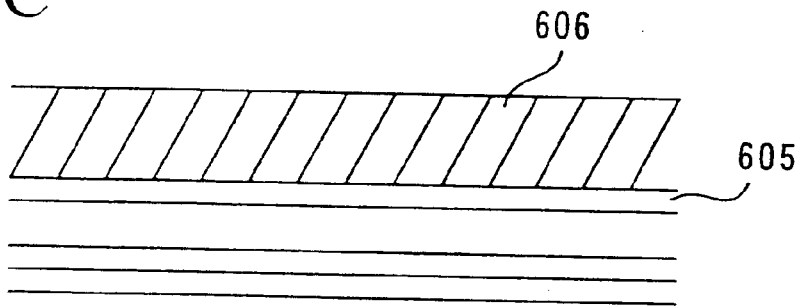
Figure 6D:
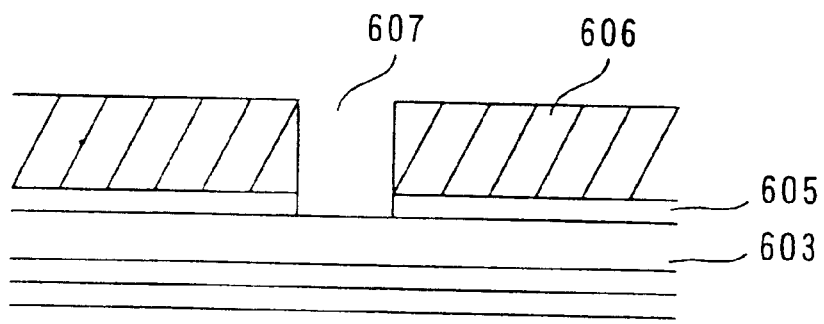
Figure 6E:
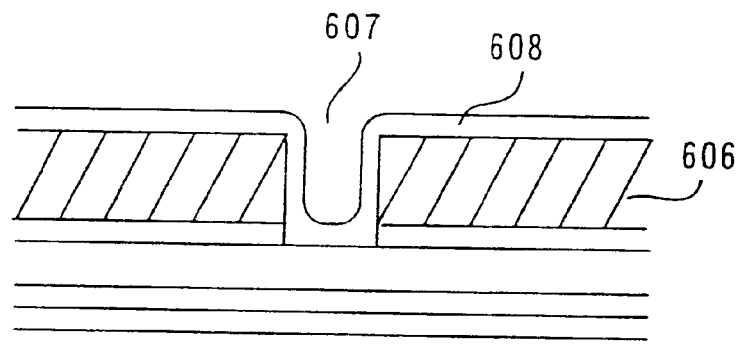
Figure 6F:
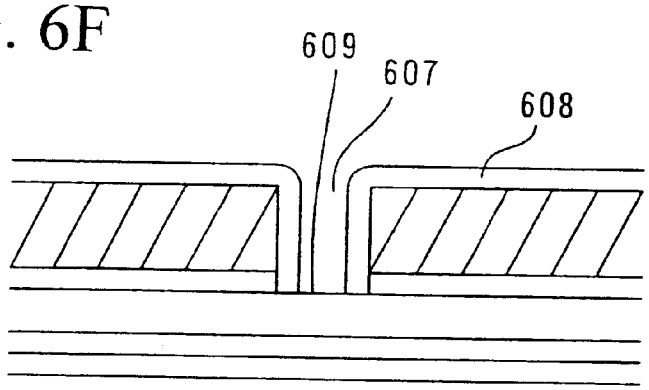
Figure 6G:
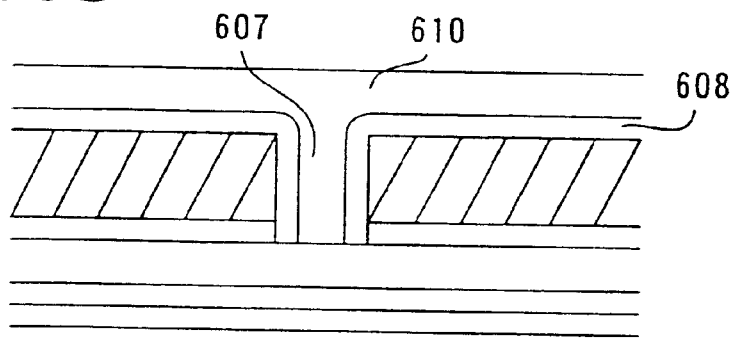
Figure 6G:
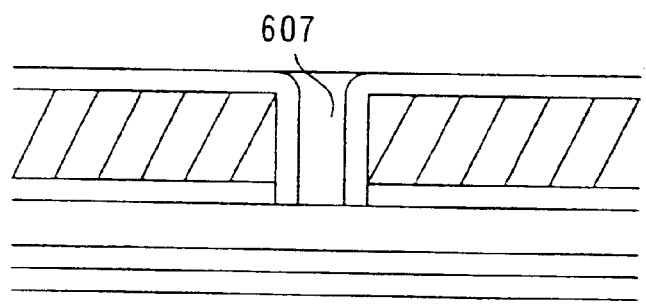
Figure 6I:
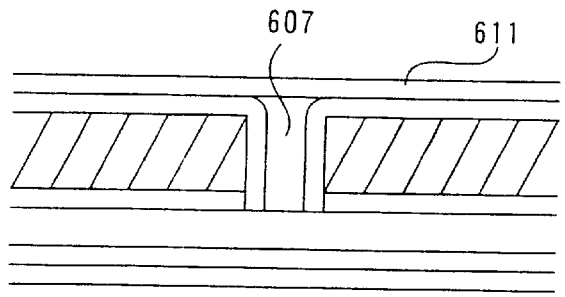
Figure 6J:
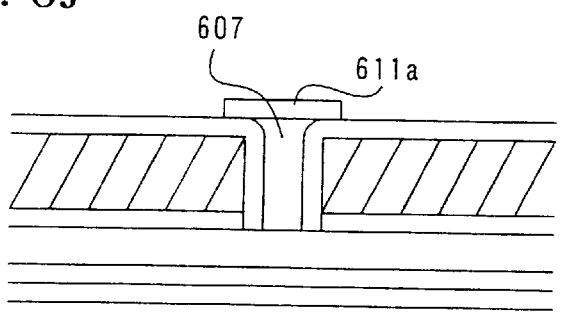
Figure 6K:
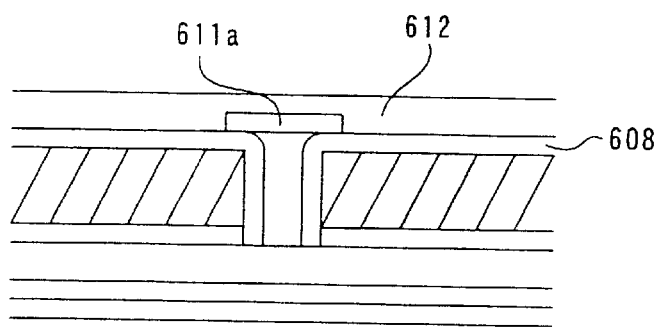
Figure 6L:
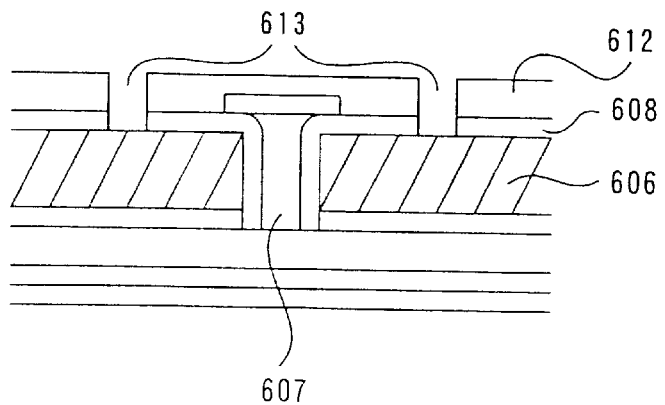
Figure 6M:
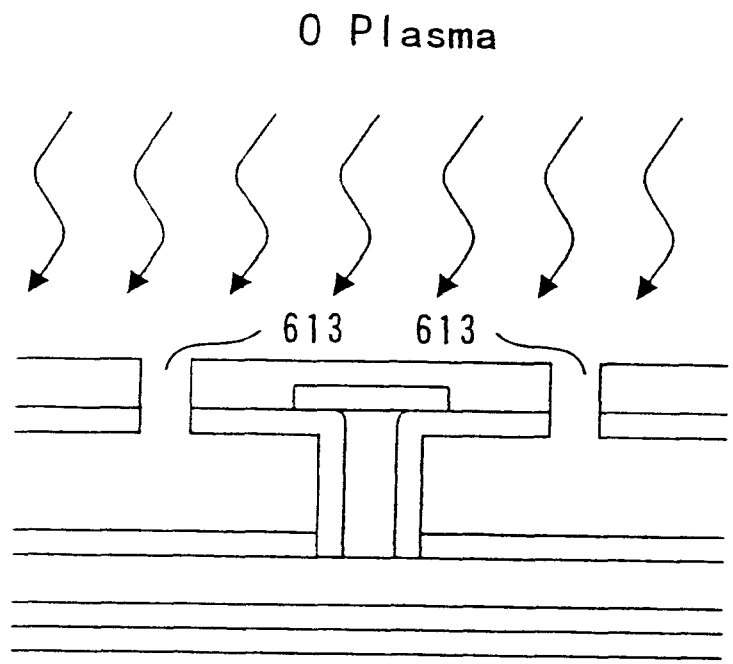
Figure 6N:
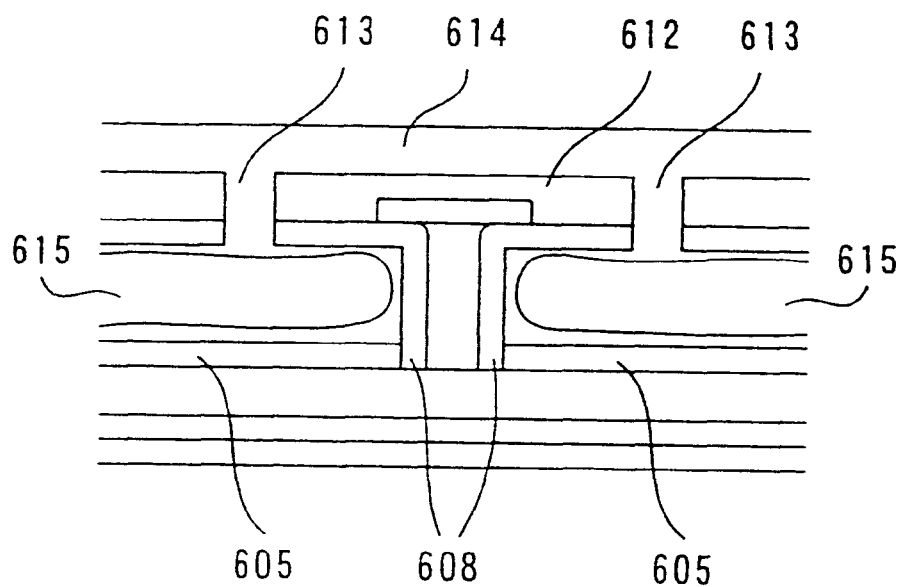

(6) Sixth Embodiment (FIGS. 6A to 6N)

The sixth embodiment applies the fifth embodiment to a damascene process.

First, as shown in FIG. 6A, a BPSG (borophosphosilicate glass) film 602 is formed on a silicon substrate 601. Then, after an aluminum layer is formed thereon, a pattern is formed in the aluminum layer to produce an aluminum wiring layer 603. It should be noted that the aluminum wiring layer 603 in the figures is not shown patterned for convenience. The silicon substrate 601, the BPSG film 602 and the aluminum wiring layer 603 serve as a substrate 604 in the method of the present invention.

Then, as shown in FIG. 6B, a $SiO_2$ film 605 having a film thickness of 50 nm is formed on the aluminum wiring layer 603 by a CVD method (chemical vapor deposition method).

Subsequently, as shown in FIG. 6C, a polyimide film 606 having a film thickness of 500 nm is formed on the $SiO_2$ film 605. This polyimide film 606 will be subjected to etching later as in the case of the fifth embodiment, and used for forming cavities in an insulating film.

Then, as shown in FIG. 6D, a pattern is formed in the $SiO_2$ film 605 and the polyimide film 606 to form a damascene trench 607 reaching the aluminum wiring layer 603.

Subsequently, as shown in FIG. 6E, a $SiO_2$ film 608 having a film thickness of 100 nm is formed on the polyimide film 606 by a plasma enhanced CVD method. In this case, the $SiO_2$ film 608 is also formed on the side and bottom portions of the damascene trench 607.

Then, as shown in FIG. 6F, anisotropic etching is performed for the $SiO_2$ film 608. Accordingly, the $SiO_2$ film 608 formed on the bottom portion of the damascene trench 607 is eliminated, and a contact hole 609 reaching the aluminum wiring layer 603 is formed. In this case, the $SiO_2$ film 608 formed on the side portion of the damascene trench 607 is left intact.

Then, as shown in FIG. 6G, a Cu film 610 is plated on the $SiO_2$ film 608 and in the damascene trench 607. The Cu-plated film in the damascene trench 607 is used as a Cu wiring line.

Then, as shown in FIG. 6H, the Cu-plated film 610 is polished by a CMP method (chemical mechanical polishing method), and superfluous Cu formed on the $SiO_2$ film 608 is eliminated. Accordingly, Cu is left only in the damascene trench 607.

Then, as shown in FIG. 6I, a barrier metal TiN film 611 is formed above the damascene trench 607. Accordingly, Cu in the damascene trench 607 can be prevented from being dispersed into an $SiO_2$ film formed later above the damascene trench 607.

Subsequently, as shown in FIG. 6J, patterning leaves a TiN film 611a formed above the damascene trench 607, and the TiN film 611 formed in the other portions is etched and thereby eliminated.

Then, as shown in FIG. 6K, a $SiO_2$ film 612 having a film thickness of 100 nm is formed on the $SiO_2$ film 608 and the TiN film 611a by a plasma enhanced CVD method.

Then, as shown in FIG. 6L, a pattern is formed in the $SiO_2$ film 608 and the $SiO_2$ film 612 formed thereon to bore holes 613 which are used for etching the polyimide film 606. Thus, the holes 613 should be formed in an area other than above the damascene trench 607, i.e., in an area where the polyimide film 606 remains, and the hole diameter should be small enough for closing later.

Subsequently, as shown in FIG. 6M, the polyimide film 606 is etched by O plasma through the hole 613.

Then, as shown in FIG. 6N, a $SiO_2$ film 614 having a film thickness of 400 nm is formed on the $SiO_2$ film 612 by a plasma enhanced CVD method. This $SiO_2$ film 614 is used for closing the holes 613. Accordingly, a cavity 615 is formed in an area surrounded by the $SiO_2$ films 605, 608 and 614.

The foregoing process results in formation of an interlayer insulating film of $SiO_2$, having cavities, on the substrate 604. This interlayer insulating film has a dielectric constant which is smaller than that of the conventional $SiO_2$ interlayer insulating film. In other words, since the dielectric constant of the cavity portion is smaller than that of $SiO_2$, the dielectric constant of the overall film is about 2.0, which is smaller than the dielectric constant 4.0 without cavities.

What is claimed is:

1. A method for forming an interlayer insulating film in a semiconductor device, comprising the steps of:

forming a first insulating film on a substrate by chemical vapor deposition using a source gas containing a Si-containing compound, said first insulating film containing at least one inclusion selected from the group consisting of $H_2O$, C and hydrocarbons; and subjecting said first insulating film to a heat treatment to discharge said one inclusion from said first insulating film, thereby forming porosity in said first insulating film.

2. A method according to claim 1, wherein said heat treatment is performed by plasma annealing.

3. A method according to claim 1, wherein said heat treatment is performed by vacuum annealing.

4. A method according to claim 1, wherein said source gas further contains $O_2$ and $H_2O$.

5. A method according to claim 1, wherein said first insulating film is formed by a plasma enhanced chemical vapor deposition, and wherein said source gas further contains $O_2$ and a CF-containing gas.

6. A method according to claim 4, wherein said Si-containing compound is TEOS or TMS.

7. A method according to claim 5, wherein said Si-containing compound is TEOS, and said CF-containing gas is $C_2F_6$.

8. A method according to claim 1, wherein said Si-containing compound is $SiH_4$ and wherein said source gas further contains $O_2$ and $H_2O$.

9. A method according to claim 1, wherein said first insulating film is formed by a plasma enhanced chemical vapor deposition, wherein said Si-containing compound is $SiH_4$ and wherein said source gas further contains $O_2$ and a boron-containing gas.

10. A method according to claim 1, wherein said first insulating film is formed by a plasma enhanced chemical vapor deposition, wherein said Si-containing compound is $SiH_4$ or $SiH_3(CH_3)$, and wherein said source gas further contains $O_2$ and $H_2O$.

11. A method according to claim 1, wherein said first insulating film is formed by a plasma enhanced chemical vapor deposition, wherein said Si-containing compound is $SiH_4$ or $SiH_3(CH_3)$, and wherein said source gas further contains $O_2$ and $B_2H_6$.

12. A method according to claim 1, further comprising, after said heat treatment, applying a hydrogen plasma treatment to said first insulating film to form Si—H bonds on pore surfaces.

13. A method for forming an interlayer insulating film, comprising the steps of:
- forming a masking film on a substrate having concavities and convexities;
- forming a first insulating film on said masking film, said first insulating film having an etching rate lower than that of said masking film;
- boring holes in said first insulating film;
- selectively etching said masking film through said holes; and
- forming a second insulating film on said first insulating film to close said holes.

14. A method according to claim 1, further comprising, subsequent to said heat treatment, forming a second insulating film on said first insulating film.

15. A method according to claim 1, wherein said substrate is a silicon base with a wiring pattern formed thereon.

16. A method according to claim 1, wherein said substrate comprises a silicon base, a BPSG film formed on said silicon base and a wiring pattern formed on said BPSG film.

17. A method according to claim 13, wherein said substrate is a silicon base with a wiring pattern formed on said silicon base.

18. A method according to claim 13, wherein said substrate comprises a silicon base, a BPSG film formed on said silicon base and a wiring pattern formed on said BPSG film.

19. A method according to claim 12, further comprising, subsequent to said hydrogen plasma treatment, forming a second insulating film on said first insulating film and wherein pores within said first insulating film contain hydrogen molecules.

20. A method according to claim 1, wherein said inclusion is C or a hydrocarbon.

* * * * *

UNITED STATES PATENT AND TRADEMARK OFFICE
CERTIFICATE OF CORRECTION

PATENT NO. : 6,281,113 B1
DATED : August 28, 2001
INVENTOR(S) : Kazuo Maeda

It is certified that error appears in the above-identified patent and that said Letters Patent is hereby corrected as shown below:

Title page,
Item [54], in the title "INTERPLAYER" should read -- INTERLAYER --

Column 2,
Line 10, "1997" should read -- 1996 --

Column 4,
Line 12, "fourth" should read -- fifth --

Column 5,
Line 2, ".600" should read -- 600 --
Line 3, "hydrogen)" should read -- (hydrogen) --

Column 7,
Line 15, after $B_2H_6$, delete "is used"
Line 29, "203" should read -- 303 --
Line 45, "Ad at" should read -- and at --

Column 9,
Line 11, "Ad at" should read -- and at --

Column 10,
Line 11, "5M" should read -- 5H --
Line 45, "5F." should read -- 5F --

Signed and Sealed this

Fourth Day of June, 2002

Attest:

JAMES E. ROGAN
*Attesting Officer*   *Director of the United States Patent and Trademark Office*